United States Patent
Ho et al.

(10) Patent No.: US 6,489,572 B2
(45) Date of Patent: Dec. 3, 2002

(54) SUBSTRATE STRUCTURE FOR AN INTEGRATED CIRCUIT PACKAGE AND METHOD FOR MANUFACTURING THE SAME

(75) Inventors: Mon Nan Ho, Hsinchu Hsien (TW); Chih-Hong Chen, Hsinchu Hsien (TW); Yen Cheng Huang, Hsinchu Hsien (TW); Li Huan Chen, Hsinchu Hsien (TW); Kuo Feng Peng, Hsinchu Hsien (TW); Jichen Wu, Hsinchu Hsien (TW); Allis Chen, Hsinchu Hsien (TW); Wen Chuan Chen, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 8 days.

(21) Appl. No.: 09/768,981

(22) Filed: Jan. 23, 2001

(65) Prior Publication Data

US 2002/0096360 A1 Jul. 25, 2002

(51) Int. Cl.[7] .............................. H05K 1/03; H05K 3/20
(52) U.S. Cl. ..................... 174/259; 174/258; 174/264; 174/265; 361/767; 361/771; 29/848; 29/849; 156/245; 156/298
(58) Field of Search ................. 179/256, 258, 179/259, 262, 264, 265, 267; 361/767, 771; 29/848, 849, 831, 845; 156/245, 298, 150, 151; 438/118, 125; 269/104, 259, 271.1, 272.11, 272.14, 272.17, 273, 279; 257/698

(56) References Cited

U.S. PATENT DOCUMENTS

| | | | | |
|---|---|---|---|---|
| 3,552,004 A | * | 1/1971 | Hagelbarger et al. | 156/150 |
| 3,889,363 A | * | 6/1975 | Davis | 156/150 |
| 5,283,468 A | * | 2/1994 | Kondo et al. | 257/698 |
| 5,478,972 A | * | 12/1995 | Mizutani et al. | 174/250 |
| 5,770,889 A | * | 6/1998 | Rostoker et al. | 257/698 |
| 6,093,476 A | * | 7/2000 | Horiuchi et al. | 174/255 |
| 6,258,627 B1 | * | 7/2001 | Benenati et al. | 438/118 |
| 6,342,407 B1 | * | 1/2002 | Goldmann et al. | 438/119 |

* cited by examiner

Primary Examiner—David L. Talbott
Assistant Examiner—John B. Vigushin
(74) Attorney, Agent, or Firm—Pro-Techtor International Services

(57) ABSTRACT

A substrate structure for an integrated circuit package. The substrate is electrically connected to a circuit board and an integrated circuit. The substrate includes a plurality of metal sheets and glue. The metal sheets are arranged opposite to each other. Each of the metal sheets includes a first surface and a second surface. The glue is used for sealing the plurality of metal sheet to form the substrate. The first surfaces and second surfaces of the metal sheets are exposed to the outside of the glue so as to form a plurality of signal input terminals for electrically connecting to the integrated circuit and a plurality of signal output terminals for electrically connecting to the circuit board. Thus, the signal output terminals of the metal sheets can be electrically connected to the circuit board smoothly. Furthermore, the signal transmission distance between the integrated circuit and the circuit board can be shortened so that better signal transmission effect can be obtained. A method for manufacturing the substrate is also disclosed.

12 Claims, 1 Drawing Sheet

SUBSTRATE STRUCTURE FOR AN INTEGRATED CIRCUIT PACKAGE AND METHOD FOR MANUFACTURING THE SAME

BACKGROUND OF THE INVENTION

1. Field of the Invention

The invention relates to a substrate structure of an integrated circuit package, in particular, to an integrated circuit package that is capable of shortening the signal transmission distances and effectively transmitting the signals to the circuit board.

2. Description of the Related Art

A general substrate for the integrated circuit package includes an integrated circuit provided thereon. The integrated circuit is electrically connected to the substrate by way of wire bonding. Then, the substrate is mounted on the circuit board for the signals from the integrated circuit to be transmitted to the circuit board.

It is necessary for the substrate to have signal input terminals and signal output terminals. After the substrate is electrically connected to the integrated circuit, the signals from the integrated circuit are transmitted to the signal input terminals of the substrate. Then, the signals are transmitted from the signal output terminals of the substrate to the circuit board. Therefore, the shorter the distances between the signal input terminals of the substrate and the signal output terminals are, the better signal transmission effect is. On the contrary, the longer the distances between the signal input terminals of the substrate and the signal output terminals are, the worse signal transmission effect is.

On the conventional substrate of the integrated circuit package is provided with a ⊏-shaped metal sheet serving as a signal input terminal and a signal output terminal of the substrate. The integrated circuit is electrically connected to the signal input terminal on one end of the ⊏-shaped metal sheet, while the signal output terminal on another end of the metal sheet is electrically connected to the circuit board. Thus, the signal transmission distance of the substrate is quite long, thereby influencing the signal transmission effect of the integrated circuit.

Moreover, when manufacturing the ⊏-shaped metal sheet, it is not easy to obtain smooth signal output terminals. In this case, when performing the signal transmission between the metal sheet and the circuit board, the signal transmission effect is not good. Thus, both the yield and the reliability of the integrated circuit package are influenced.

In order to overcome the above-mentioned problems, a substrate structure of an integrated circuit package and a method for manufacturing the same is provided so as to improve the signal transmission effect of the integrated circuit and the yield and reliability of the integrated circuit package.

SUMMARY OF THE INVENTION

It is therefore an object of the invention to provide a substrate for the integrated circuit package and a method for manufacturing the same, in order to shorten the signal transmission distance between the integrated circuit and the circuit board and improve the signal transmission effect.

It is therefore another object of the invention to provide a substrate for the integrated circuit package and a method for manufacturing the same, in order to make the substrate effectively contact with the integrated circuit package and improve the signal transmission effect.

According to one aspect of the invention, a substrate structure for an integrated circuit package is provided. The substrate is electrically connected to a circuit board and an integrated circuit. The substrate includes a plurality of metal sheets and glue. The metal sheets are arranged opposite to each other. Each of the metal sheets includes a first surface and a second surface. The glue is used for sealing the plurality of metal sheet to form the substrate. The first surfaces and second surfaces of the metal sheets are exposed to the outside of the glue so as to form a plurality of signal input terminals for electrically connecting to the integrated circuit and a plurality of signal output terminals for electrically connecting to the circuit board.

According to another aspect of the invention, a method for manufacturing a substrate structure for an integrated circuit package including the steps of: arranging a plurality of metal sheets, each of which having a first surface and a second surface, into a mold, the plurality of metal sheets being arranged opposite to each other; pouring glue into the mold for sealing the plurality of metal sheets to form the substrate, the first surfaces and second surfaces of the metal sheets being exposed to the outside of the glue to form a plurality of signal input terminals and signal output terminals of the substrate; and taking the substrate out of the mold.

According to the structure and method of the invention, the signal output terminals of the metal sheets can be electrically connected to the circuit board smoothly. Furthermore, the signal transmission distance between the integrated circuit and the circuit board can be shortened so that better signal transmission effect can be obtained.

DETAIL DESCRIPTION OF THE INVENTION

Figure 1:
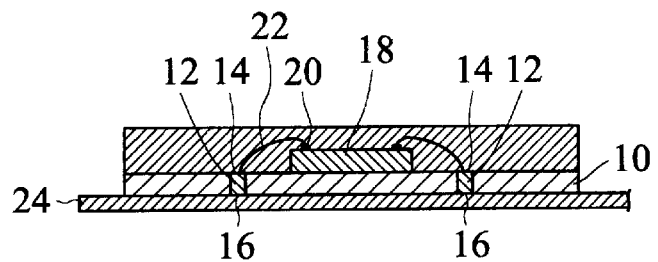
FIG. 1 is a schematic illustration showing a substrate of the integrated circuit package according to the invention.

Referring to FIG. 1, the substrate 10 includes a plurality of flat metal sheets 12 each having a first surface 14 and a second surface 16. The first surfaces 14 are electrically connected to the bonding pads 20 of the integrated circuit 18 through a plurality of wirings 22 by way of wire bonding. One end of a wiring 22 is connected to one corresponding bonding pad 20 of the integrated circuit 18, while the other end of the wiring 22 is connected to one corresponding first surface 14 of the metal sheets 12. The second surfaces 16 of the metal sheets 12 are electrically connected to the circuit board 24. Thus, the signals from the integrated circuit 18 can be transmitted to the circuit board 24 via the metal sheets 12, and the electrical connection relationship between the integrated circuit 18 and the circuit board 24 can be thus constructed.

Figure 2:
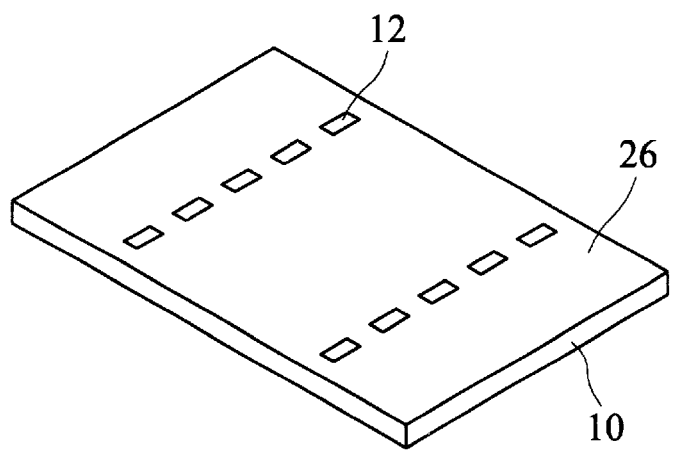
FIG. 2 is a pictorial view showing the substrate of the integrated circuit package according to the invention.

Referring to FIG. 2, on the substrate 10 are provided with a plurality of metal sheets 12 arranged opposite to each other. Each of the metal sheets 12 has a first surface 14 and a second surface 16.

The glue 26 made of plastic materials are used for sealing the metal sheets 12 to form the substrate 10. Both of the first surfaces 14 and the second surfaces 16 of the metal sheets 12 are exposed to the outside of the glue 26. Therefore, it is possible to form signal input terminals for connecting to the integrated circuit 18 and signal output terminals for connecting to the circuit board 24 (as shown in FIG. 1).

The method for manufacturing the substrate structure will be described hereinbelow.

Figure 3:
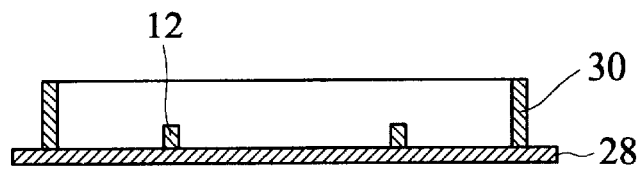
FIG. 3 is a first schematic illustration showing the method for manufacturing the substrate of the integrated circuit package according to the invention.

Referring to FIG. 3, first, a tape 28 is provided for the metal sheets 12 to be adhered thereon. Then, the tape 28 is placed into the bottom of a hollow mold 30.

Figure 4:
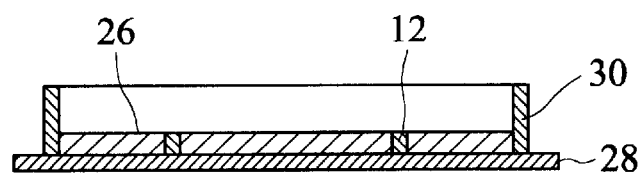
FIG. 4 is a second schematic illustration showing the method for manufacturing the substrate of the integrated circuit package according to the invention.

Referring to FIG. 4, the glue 26 is poured into the mold 30 for sealing each of the metal sheets 12. The first surfaces 14 of the metal sheets 12 are exposed to the outside of the glue 26 in order to form signal input terminals of the substrate 10 for connecting to the integrated circuit 18 (as shown in FIG. 1). Thereafter, the tape 28 is torn. Then, the substrate 10 is taken out of the mold 30 to complete the structure of the substrate 10. At this time, the second surfaces 16 of the metal sheets 12 are exposed to the outside of the glue 26 to form the signal output terminals of the substrate 10 for connecting to the circuit board 24 (as shown in FIG. 1). In addition, the second surfaces 16 of the metal sheets 12 of the substrate 10 may include a plurality of metallic balls (not shown) formed in a ball grid array. The metallic balls are used for electrically connecting to the circuit board 24.

According to the structure and method of the invention, the following advantages can be obtained.

1. By using the substrate 10 consisting of the metal sheets 12 and the glue 26 as the transmission medium for transmitting the signals from the integrated circuit 18 to the circuit board 24, shorter transmission distances and better signal transmission effects can be obtained.

2. Since the metal sheets 12 has smooth second surfaces 16, a better electrical contact effect between the circuit board 24 and the substrate 10 can be obtained.

While the invention has been described by way of example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A substrate structure for an integrated circuit package, the substrate being electrically connected to a circuit board and an integrated circuit, the substrate comprising:

a plurality of metal sheets arranged opposite to each other, each of the metal sheets includes a first surface and a second surface; and glue for sealing the plurality of metal sheets to form the substrate, the first surfaces and second surfaces of the metal sheets being exposed to the outside of the glue, so as to form a plurality of signal input terminals for electrically connecting to the integrated circuit and a plurality of signal output terminals for electrically connecting to the circuit board.

2. The substrate structure for the integrated circuit package according to claim 1, wherein the plurality of metal sheets are smooth metal sheets.

3. The substrate structure for the integrated circuit package according to claim 1, wherein the integrated circuit is electrically connected to the first surfaces of the metal sheet by way of wire bonding.

4. The substrate structure for the integrated circuit package according to claim 1, wherein each of the second surfaces of the metal sheets of the substrate is formed with a metallic ball.

5. The substrate structure for the integrated circuit package according to claim 4, wherein the metallic balls are in the form of a ball grid array.

6. The substrate structure for the integrated circuit package according to claim 1, wherein the glue is made of plastic materials.

7. A method for manufacturing a substrate structure for an integrated circuit package, comprising the steps of:

arranging a plurality of metal sheets, each of which having a first surface and a second surface, into a mold, the plurality of metal sheets being arranged opposite to each other;

pouring glue into the mold for sealing the plurality of metal sheets to form the substrate, the first surfaces and second surfaces of the metal sheets being exposed to the outside of the glue to form a plurality of signal input terminals and signal output terminals of the substrate; and taking the substrate out of the mold.

8. The method for manufacturing the substrate structure for the integrated circuit package according to claim 7, wherein the metal sheets are adhered onto a tape in advance, and then, the tape with the metal sheets is placed into the mold.

9. The method for manufacturing the substrate structure for the integrated circuit package according to claim 8, wherein after the glue is poured into the mold, the tape is torn next, and the substrate is taken out of the mold.

10. The method for manufacturing the substrate structure for the integrated circuit package according to claim 7, wherein the glue is made of plastic materials.

11. The method for manufacturing the substrate structure for the integrated circuit package according to claim 7, further comprising the step of providing a metallic ball on the second surface of each of the metal sheets of the substrate.

12. The method for manufacturing the substrate structure for the integrated circuit package according to claim 11, wherein the metallic balls are in the form of a ball grid array.

* * * * *